US012658665B2

(12) United States Patent
Diroll

(10) Patent No.: US 12,658,665 B2
(45) Date of Patent: Jun. 16, 2026

(54) LASER DEVICE AND METHOD OF ACHIEVING OPTICAL GAIN WITH COLLOIDAL QUANTUM FOUNTAINS

(71) Applicant: UCHICAGO ARGONNE, LLC, Chicago, IL (US)

(72) Inventor: Benjamin Diroll, Chicago, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 1153 days.

(21) Appl. No.: 17/676,307

(22) Filed: Feb. 21, 2022

(65) Prior Publication Data

US 2023/0268709 A1     Aug. 24, 2023

(51) Int. Cl.
| | |
|---|---|
| *H01S 3/16* | (2006.01) |
| *H01S 3/094* | (2006.01) |
| *H01S 3/0941* | (2006.01) |
| *H01S 5/04* | (2006.01) |
| *H01S 5/10* | (2021.01) |
| *H01S 5/30* | (2006.01) |
| *H01S 5/34* | (2006.01) |

(52) U.S. Cl.
CPC ............ *H01S 3/169* (2013.01); *H01S 5/3402* (2013.01); *H01S 5/3412* (2013.01); *H01S 5/3419* (2013.01); *H01S 3/094096* (2013.01); *H01S 3/09415* (2013.01); *H01S 3/1628* (2013.01); *H01S 5/041* (2013.01); *H01S 5/1067* (2013.01); *H01S 5/3018* (2013.01)

(58) Field of Classification Search
CPC ...... H01S 3/169; H01S 5/3402; H01S 5/3412; H01S 3/094096; H01S 3/09415; H01S 3/1628; H01S 5/041; H01S 5/1067; H01S 5/3018
See application file for complete search history.

(56) References Cited

U.S. PATENT DOCUMENTS

| | | | | |
|---|---|---|---|---|
| 5,200,969 A * | 4/1993 | Paoli | ..................... | H01S 3/1061 |
| | | | | 372/50.1 |
| 2004/0173883 A1 * | 9/2004 | Ohno | .................... | H10F 77/146 |
| | | | | 257/668 |

(Continued)

OTHER PUBLICATIONS

Gauthier-Lafaye, O. et al., "Long-wavelength (>>15.5 µM) unipolar semiconductor laser in GaAs quantum wells," *Applied Physics Letters*, 71, 3619 (1997).

(Continued)

*Primary Examiner* — M. A. Golub-Miller
(74) *Attorney, Agent, or Firm* — MARSHALL, GERSTEIN & BORUN LLP

(57)          ABSTRACT

Optical gain mediums are required for lasing devices and high intensity optical systems across a wide range of applications. A method for achieving optical gain includes an optical gain medium having colloidal quantum fountains includes providing pump radiation to the gain medium. The electrons of the colloidal quantum fountains are promoted from a valence band to an excited state in a conduction band of the colloidal quantum fountains. Seed radiation is provided to the gain medium and electrons of the quantum fountains are de-excited by the seed radiation through stimulated emission from the excited state to a lower energy state of the conduction band, thereby providing optical gain.

7 Claims, 11 Drawing Sheets

(56) References Cited

U.S. PATENT DOCUMENTS

| | | | | |
|---|---|---|---|---|
| 2020/0256519 | A1* | 8/2020 | Diroll | .................. C09K 11/883 |
| 2020/0387016 | A1* | 12/2020 | Diroll | ................ G02F 1/01716 |

OTHER PUBLICATIONS

Julien, F. H. et al., "Intersubband mid-infrared emission in optically pumped quantum wells," *Superlattices and Microstructures*, vol. 19, No. 1 (1996).

Gauthier-Lafaye, O. et al., High-power GaAs/AlGaAs quantum fountain unipolar laser emitting at 14.5 μm with 2.5% tunability, *Applied Physics Letters*, 74, 1537 (1999).

Julien, F. H. et al., Optically pumped intersub-band emission in quantum wells, Electronic Letters, vol. 31, No. 10 (1995).

Julien, F. H. et al., "Quantum Fountain Intersubband Laswer at 15.5 μm Wavelength in GaAs/A1GaAs Quantum Wells," *Intersubband Transitions in Quantum Wells: Physics and Devices*, pp. 9-16 (1998).

* cited by examiner

700

702 — Provide Pump Radiation To Quantum Fountain

704 — Exciting Electron From Valence Band to Conduction Band

706 — Provide Seed Radiation To Gain Medium

708 — Induce Stimulated Emission Of Output Radiation

800

807a    807b    805

A 805    805

LASER DEVICE AND METHOD OF ACHIEVING OPTICAL GAIN WITH COLLOIDAL QUANTUM FOUNTAINS

STATEMENT REGARDING FEDERALLY SPONSORED RESEARCH OR DEVELOPMENT

This invention was made with government support under Contract No. DE-AC02-06CH11357 awarded by the United States Department of Energy to UChicago Argonne, LLC, operator of Argonne National Laboratory. The government has certain rights in the invention.

FIELD OF THE DISCLOSURE

The present disclosure relates to methods and systems for an optical gain medium, and specifically to an interband pumped optical gain medium that includes colloidal quantum fountains.

BACKGROUND

Laser media and devices are valuable, and even required, across a wide range of industries. Specifically, laser devices that operate in the near infrared range are technologically valuable in communications, medicine, research, and part manufacturing, among other fields of endeavor. Lasing devices require specific physical conditions to operate. For example, a lasing device must achieve an amount of stimulated emission that exceeds a lasing threshold of the device to operate as a laser. One physical element that contributes to proper operation of a laser is the gain medium of the laser. The gain medium is a material having properties that allows for amplification of light through stimulated emission. The gain medium may be a gas, a fluid, or a solid material that can absorb energy, and emit light.

The operating wavelengths of a lasing device depend on the gain medium of the device. For example, a neodymium-doped yttrium aluminum garnet (Yd: YAG) laser operates at visible wavelengths, while a $CO_2$ laser operates in the microwave regime. Laser devices that operate in near infrared wavelengths are particularly valuable for communications and biological applications. Most laser mediums that operate in the near infrared use rigid semiconductor materials as the gain medium. Semiconductor based devices are not readily scalable due to material limitations, and miniaturization of semiconductor laser is limited. Further, semiconductor devices are limited in lasing wavelength ranges due to the excitation energies achievable in semiconductor materials. Wavelength tunability of a semiconductor device is also very limited as the rigid structures of semiconductor materials create challenges in tuning thicknesses and purities of materials at scales of nanometer and tens of nanometers. Due to the broad range of uses of lasing devices, there is need for lasing devices that utilize gain mediums that may be fabricated to operate across various bands of wavelengths, using materials and methods allowing for miniaturization and for implementation in a variety of form factors.

SUMMARY OF THE DISCLOSURE

In an embodiment, disclosed is a method for achieving optical gain. The method includes providing pump radiation to a gain medium. The gain medium includes colloidal quantum fountains with charge carriers in valence bands of the colloidal quantum fountains. The pump radiation excites the charge carriers across a bandgap of the colloidal quantum fountains from the valence band to an excited state in a conduction band of the colloidal quantum fountains. Seed radiation is provided to the gain medium and output radiation is generated through stimulated emission from the de-excitation of the charge carriers. In variations of the current embodiment, the colloidal quantum fountains are colloidal cadmium selenide nanoplates that may include surfactant outer coatings.

In another embodiment, disclosed is a lasing device. The lasing device includes an optical gain medium, a pump radiation source, and a seed radiation source. The gain medium is disposed in an optical cavity, and the gain medium includes a plurality of colloidal quantum fountains. The colloidal quantum fountains have a valence band, first excited conduction band state, and second excited conduction band state. The pump source is configured to provide pump radiation to the gain medium, with the pump radiation having an energy capable of exciting charge carriers from the valence band to the second excited conduction band state of the colloidal quantum fountains. The seed radiation source is configured to provide seed radiation to the gain medium, with the seed radiation having an energy capable of causing de-excitation of charge carriers from the second excited conduction band state to the first excited conduction band state, therefore inducing stimulated emission of radiation from the de-excitation of the charge carriers.

DETAILED DESCRIPTION

Laser devices are valuable across a wide range of industries from medical devices to defense and communication systems. As such, each application that uses a laser may require different outputs, parameters, or conditions of operation for the laser. For example, some systems may require a laser to output radiation at visible wavelengths, while another application may require laser radiation at infra-red wavelengths. Additionally, lasers may be required to be employed in different environments including very humid or wet environments, dry environments, or environments under extreme heat or pressure, just to name a few. As such, the specific materials and form factors of laser devices are important for meeting the requirements of each individual application and environment for employing a laser device.

In electromagnetics, it is common to distinguish between a frequency, wavelength, energy, and color of electromagnetic radiation. Each of these four characteristics is related to the other three. For example, the wavelength, in nanometers (nm), and frequency, in hertz (Hz), for a specified electromagnetic radiation are inversely proportional to each other. Similarly, the energy, in electron-volts (eV) or joules (J), of electromagnetic radiation is proportional to the frequency of that radiation. Therefore, for a given radiation at a given frequency, there is a corresponding wavelength and energy. The color of a photon or electromagnetic radiation typically represents a group of band of frequencies, or a frequency shift of light (i.e., blue-shift means decreasing in wavelength while red-shift means increasing in wavelength.) Some areas of trade in electromagnetics prefer the use of one of the four terms over the others (e.g., color and wavelength are preferred when discussing optical filters, whereas frequency and energy are preferred when optical excitation processes). Therefore, the four terms may be understood to be freely interchangeable as appropriate, in the following discussion of electromagnetic radiation, photons, quantum states, electrons, and radiation sources.

Additionally, as a person of ordinary skill in the art would understand, the terms excited state, excitation state, quantum state, and energy state can be interchangeable when describing the state of a system. Also, the states of a system may also be described as having or existing with a specific energy, E, associated with the state. Therefore, it should be understood that a state may be referred to as an energy state E, or a state with energy E interchangeably. As such, it should be understood that a label E may refer to the energy of a state and/or to the state itself.

Figure 1:
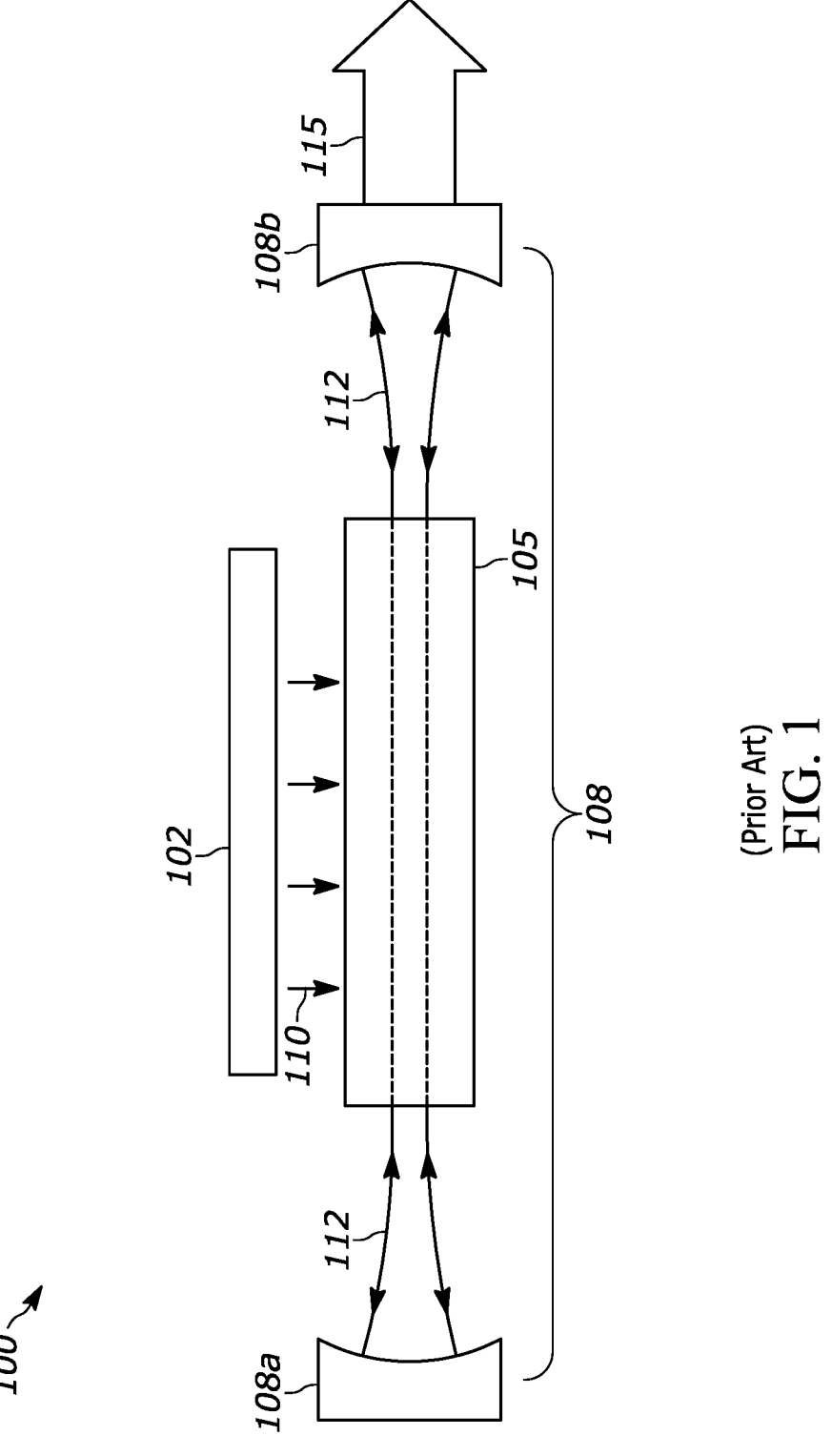
FIG. 1 is a block diagram of a laser device having a pump source, gain medium, and radiation cavity.

FIG. 1 is a block diagram of a typical laser device 100 having a pump source 102, a gain medium 105, and a radiation cavity 108. The pump source 102 provides pump radiation 110 to the gain medium 105 to provide energy to the gain medium 105. The pump radiation 110 has a frequency corresponding to an excitation energy of the gain medium 105, and the pump radiation 110 excites electrons of the gain medium 105 to an excited state. The electrons then decay back to a lower energy state and emit radiation 112 into the radiation cavity 108. The radiation cavity 108 includes two mirrors, a back mirror 108a that is highly reflective, (i.e., approximately 100% reflective for the wavelength of the radiation 112), and a front mirror 108b that is partially transmissive at the wavelength of the radiation 112.

The mirrors 108a and 108b provide optical feedback to the gain medium causing stimulated emission of more photons having a same wavelength as the radiation 112, and further causing emission of coherent radiation. The front mirror 108b transmits a portion of the radiation 112 as output radiation 115. The output radiation 115 is coherent radiation at a wavelength determined by the properties of the gain medium, as further discussed herein.

Figure 2C:
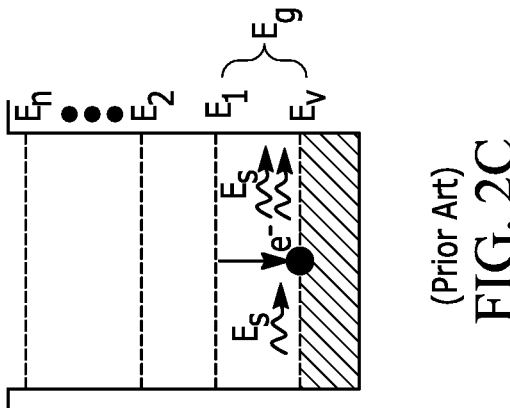
FIG. 2C is a diagram illustrating emission of radiation and relaxation of the electron from an excited state to a valence conduction band.
Figure 2B:
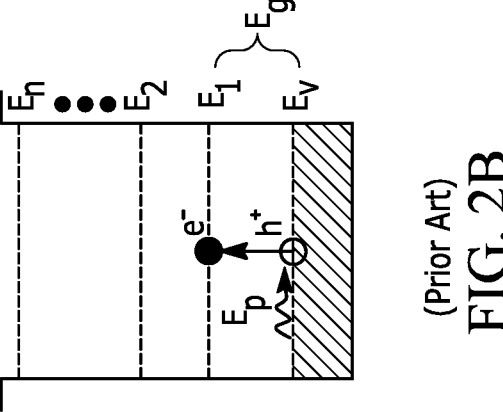
FIG. 2B is a diagram illustrating radiation exciting an electron from the ground valence state to an excited state in a conduction band.
Figure 2A:
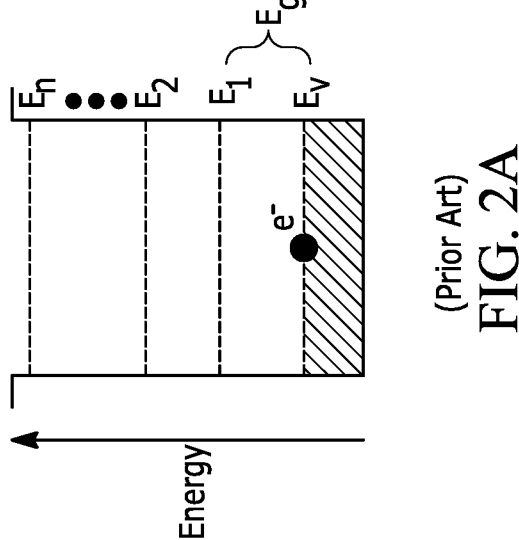
FIG. 2A is a diagram illustrating a quantum well with an electron in a ground energy state of a valence band.

FIGS. 2A-2C are diagrams illustrating stimulated emission from an epitaxial quantum well. FIGS. 2A-2C show a radiation emitting electron, e, and a plurality of energy states including a ground valence energy state, $E_v$, a first excited energy state, $E_1$, a second excited state $E_2$, and potentially other higher energy states from up to $E_n$. For typical epitaxial quantum wells, the ground energy state is in a valence band of a material, and the first excited state and second excited states are in a conduction band of a material. For clarity and simplicity, the first excited state is the lowest energy excited state of the system with an energy $E_1$, and the second excited state has an energy $E_2$ that is greater than $E_1$. The system illustrated in FIGS. 2A-2C may have more energy levels, but the ground, first, and second excited levels will be used for discussion of examples herein. A person of ordinary skill in the art would recognize that the terms excite, promote, or energize are often interchangeable when discussing the transition of a system from one energy level to another, higher, energy level, and similarly the terms de-excite, rest, and recombine may be used interchangeably when discussing the transition of a system from one energy level to another, lower, energy level in the conduction band.

FIG. 2A illustrates the electron at the ground valence energy state $E_v$ of the system, in the valence band. Typically, the electron would be at the ground state unless energy is provided to the electron to excite the electron to an excited state. For example, heat energy in the form of one or more phonons, electromagnetic energy in the form of one or more photons, or electrical energy in the form of a current may each be provided to excite the electron to an excited state. Accordingly, the electron remains in the ground state at a stasis until an energy source provides excitation energy to the electron.

FIG. 2B illustrates a pump photon with energy $E_p$ exciting the electron from the ground valence band state to the first excited state of the conduction band, leaving behind a positively charged hole in the valence band. The energy $E_p$ of the photon must be equal to or greater than the first excited energy E, to excite the electron to the first excited state. Once in the excited state, the electron may de-excite or relax back down to recombine with the positive hole at the ground valence level. The spontaneous recombination of the electron with the hole may occur and the electron-hole recombination may cause the release of a photon through spontaneous emission, and/or a phonon. Alternatively, as illustrated in FIG. 2C, a seed photon may be provided to the electron that forces the electron, through stimulated emission, to recombine with the hole and emit a photon. In the example illustrated in FIG. 2C, a seed photon having an energy $E_s$ is provided to the electron-hole pair, with the photon having an energy equal to the energy bandgap of the material (i.e., $E_s = _Eg = E_1 - E_v$). The electron then emits a photon having the same energy as the seed photon. The process of stimulated emission illustrated in FIGS. 2A-2C is one means for providing optical gain in the gain medium 105 of the laser 100 of FIG. 1.

Typically quantum wells used for optical gain mediums are bipolar devices that occupy energy levels in conduction and valence bands of materials. As described with reference to FIGS. 2A-2C, bipolar devices utilize both electrons and holes as charge carriers and excitation of a charge carrier may be considered as a separation of an electron-hole pair, while recombination of the electron-hole pair constitutes de-excitation. Bipolar gain mediums typically are fabricated using semiconductor materials, in particular, epitaxial quantum wells. The epitaxial quantum wells are used to amplify radiation through stimulated emission, as described in reference to FIGS. 2A-2C. Typically, gain is achieved in bipolar devices through generating a population inversion of excited electrons, and then using the interband recombination of electrons and holes across a bandgap causing the emission of radiation. Bipolar quantum wells that employ the interband electron-hole recombination are typically physically inflexible. Epitaxial bipolar devices are also polarization dependent which limits the form factors of the bipolar devices. For example, the epitaxial bipolar devices must have certain sizes and orientations relative to other optical elements such as a resonance cavity for generating radiation. Conversely, the disclosed colloidal unipolar gain devices may have any orientations and many form factors such as the colloids may be laminated onto an arbitrary surface having any geometry or shape, the colloids may be disposed in a medium or on a surface at any given orientation such as "edge up" or "face down" configurations. Therefore, the polarization is decoupled from the form factor of the unipolar colloidal fountains allowing for much more flexibility in form factor of gain devices. Although widely used, epitaxial bipolar gain mediums are limited in ability to miniaturize the devices, have very little structural flexibility and are therefore limited in form factor and in spectral gain bandwidths.

Quantum fountains are unipolar in nature in that the fountains only involve the excitation and de-excitation of a majority charge carrier in energy state transitions. Therefore, quantum fountains do not require the presence of both an electron and a hole for stimulated or spontaneous emission for performing optical gain. The de-excitation of an electron from an excited conduction energy level to a lower conduction band energy level is therefore an intraband transition, or a subband transition. The described colloidal quantum fountains demonstrate interband pumped, intraband gain operation which allows for spectrally remote pump and seed radiation to be used for achieving optical gain.

Bipolar devices are limited in the wavelengths of output radiation as compared to unipolar devices. For example, the gain spectra of bipolar devices are limited to the bandgap of a given material. The unipolar quantum fountains described herein may be tuned across a broad range of wavelengths by controlling the physical dimensions of the quantum fountain. Further, surface coatings may be applied to the described colloidal quantum fountains to tune the gain band of the colloidal quantum fountains. As shown herein, the optical gain spectra of the colloidal quantum fountains may be tuned between 1000 nm and 1600 nm, by controlling the number of monolayers and by providing different coatings or suspension medias. The optical gain spectra may be tuned to longer or shorter wavelengths by using different materials, thicknesses of materials, and providing different surface coatings and suspension mediums. For example, it is envisioned that the number of monolayers and coatings may be tuned to provide a gain spectra having a peak at wavelengths shorter than 2 μm, shorter than 2.5 μm, or shorter than 3 μm. Quantum fountains may be fabricated as nanoplates, nanospheres, nanoparticles, quantum dots, quantum wires, quantum wells, or another quantum device or system that exhibits a plurality of energy states in the conduction band. Any structure may be implemented as a colloidal quantum fountain that has one physical dimension that is smaller than the Bohr radius of the material. Therefore, the quantum fountains may be a structure that has one physical dimension that is between 1 and 100 nm, between 50 and 500 nm, less than 200 nm, or less than 20 nm.

Quantum fountains, as described herein may be fabricated as colloidal semiconductor nanoplates. The nanoplates described herein may be considered to be quantum wells, but specifically, it should be noted, that the quantum fountains and quantum wells described herein are specifically non-epitaxial quantum wells. Non-epitaxial being that the quantum fountains, and resultant nanostructures are not grown on a substrate. The colloidal nanoplates are atomically flat structures that do not rely on recombination and therefore are more efficient for performing optical gain that other types of gain materials. As a person of ordinary skill in the art would recognize, "atomically flat" is used herein to indicate a nanoscopic structure that has a thickness of exactly "x" atoms, with x/2 monolayers. For example, a 5.5 monolayer CdSe nanoplate has a total thickness of x=11 atoms, with 5.5 total monolayers (i.e., 5 layers of selenium, and 6 layers of cadmium). Colloidal quantum fountains may be platelets having a single monolayer, between 1.5 and 6.5 monolayers, less than 10.5 monolayers, less than 15.5 monolayers, or less than 20.5 monolayers. The colloidal quantum fountains may be suspended in a solution and contained in a cuvette, or other chamber for performing optical gain. As such, an optical gain medium that employs colloidal quantum fountains is robust in form factor and can have a variety of geometries. Additionally, the gain medium may be as small or as large as desired or required, depending on the size and concentration of the colloidal quantum fountains and associated optical gain.

Figures 3A, 3B, 3C:
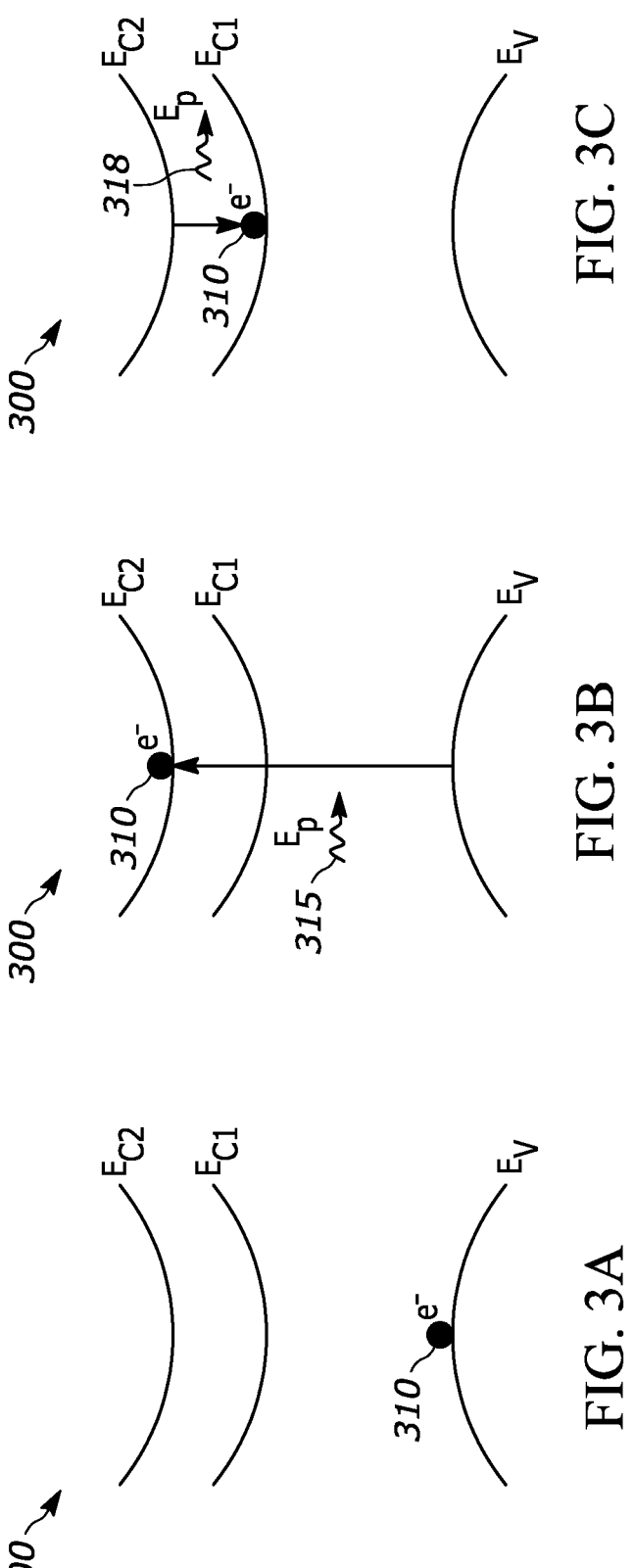
FIG. 3A is a diagram illustrating optical gain of a quantum fountain with an electron in a valence band of the quantum fountain.
FIG. 3B is a diagram illustrating radiation exciting an electron from the valence band to an excited conduction band state of the quantum fountain.
FIG. 3C is a diagram illustrating intraband stimulated emission of radiation from the electron in the quantum fountain.

FIGS. 3A-3C are diagrams illustrating optical gain using interband quantum states of a quantum fountain according to the methods and devices described herein. FIGS. 3A-3C present a system 300 having three states: a ground state as a valence energy state with energy $E_v$, a first conduction band energy state with energy $E_{c1}$, and a second conduction band state with energy $E_{c2}$. FIG. 3A illustrates an electron 310 residing in the valence band. The valence band represents an energy level that electrons in the outermost orbitals or shells of a quantum fountain can occupy. Electrons in the valence band may be excited across a bandgap, having an energy of $E_G$ into conduction band energy states of the quantum fountain. The bandgap of the system 300 of FIGS. 3A-3C is the energy difference between the valence band and the first conduction band energy state (i.e., $E_G=E_{C1}-E_v$).

FIG. 3B illustrates a pump photon 315, with energy $E_p$, exciting the electron 310 from the valence band to the second state of the conduction band. The pump photon 315 must have an energy that is equal to or greater than the difference between the energies of the second state of the valence band (i.e., $E_p>E_{C2}-E_v$). The pump photon 315 may have an energy in the ultraviolet range with a wavelength between 10 and 400 nm, between 100 and 500 nm, or a wavelength shorter than visible light.

FIG. 3C illustrates the electron 310 relaxing down into the first state of the conduction band and emitting output radiation 318. The output radiation has an energy equal to the difference between the second conduction energy and the first conduction energy (i.e., $E_O=E_{C2}-E_{c1}$). The electron may relax through stimulated emission by providing a seed photon or seed radiation to the electron, or the electron may relax through spontaneous emission of the output radiation 318.

The system 300 of FIGS. 3A-3C is illustrative of inter-band pumped optical gain that uses intraband transitions in the conduction band to generate stimulated emission. The difference between the energies of the interband and intra-band transitions, and therefore, the energies of the pump photon 315 and the output radiation 318 allows for the system to be pumped at wavelengths in the ultraviolet band, while the optical gain of the system is realized at near-infrared wavelengths. For example, the pump photon 315 may have a wavelength shorter than 300 nm, shorter than 500 nm, shorter than 700 nm, or shorter than 1 μm, while the optical gain is realized at wavelengths between 700 and 1500 nm, between 1000 and 2000 nm, wavelengths less than 2000 nm, wavelengths less than 3000 nm, or wavelengths between 750 nm and 1 mm. As such, the regime presented in FIGS. 3A-3C illustrates a system with spectrally remote pumping as compared to the gain wavelengths. Therefore, filtering out of residual pump radiation is much easier to perform than other systems that use infrared, mid-infrared, or near-infrared radiation as the pump. Further, a seed photon or seed radiation may be provided to the electron with the seed radiation being in the infrared regime allowing for filtering of the pump and seed radiation as required.

Employing spectrally remote pumps, as compared to the seed and output radiation, allows for the colloidal quantum fountains to be in a medium such as a suspension material, or in a laser cavity, that is transparent at the pump wave-lengths, but allows for lasing at the gain wavelengths. Utilizing visible or ultraviolet pump sources also provides for safer operation because visible radiation is more easily traced and located, and visible radiation initiates self-pro-tective responses such as closing or blinking of the eye. The spectrally remote pumping of the optical gain described herein allows for reduced size, cost, and overall complexity of optical systems compared to devices that use pumps having wavelengths in a same wavelength band, or spec-trally closer to the output radiation 318. Further, utilizing pumps in the visible and ultra-violet regimes allows for access to available pump sources having very short pulses (e.g., femtosecond pulses)

Figure 4:
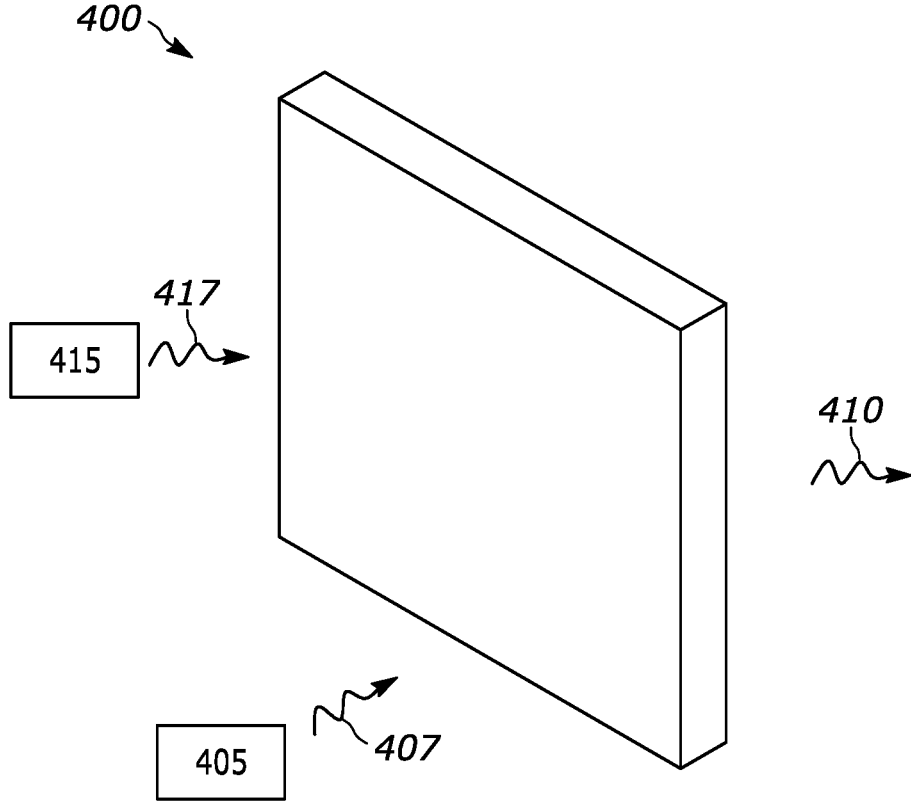
FIG. 4 illustrates a colloidal quantum fountain as a nanoplate that may be employed in a gain medium for a lasing device.

FIG. 4 illustrates a colloidal quantum fountain as a nanoplate 400 that may be employed in a gain medium for a lasing device. A pump radiation source 405 provides pump radiation 407 to the nanoplate 400 and excites an electron from the valence band of the nanoplate 400 to an excited state in the conduction band of the nanoplate 400, as illustrated in FIGS. 3A-3C. The electron then de-excites and emits output radiation 410 through spontaneous emission. Alternatively, a seed source 415 may provide seed radiation 417 to the nanoplate 400 to induce stimulated emission of the output radiation 410. The pump radiation 407 has a wavelength in the ultra-violet range to provide energy to the electron equal to or greater than the bandgap of the nano-plate 400 to promote the electron from the valence band to the conduction band. The seed radiation has a wavelength in the infrared wavelength range to cause intra-subband de-excitation between energy states of the conduction band of the nanoplate 400.

The pump radiation source 405 and seed radiation source may each independently be a laser, light emitting diode, single-photon source, a black-body radiation source, an ultra-violet radiation source, or another source or combina-tion of sources to provide the desired ultra-violet radiation to the colloidal nanoplate 400. The pump radiation 407 and seed radiation may independently be continuous radiation, pulsed radiation with a constant duty cycle, pulsed radiation with a duty cycle that increases or decreases over time, pulsed radiation with a pulse repetition frequency that increases or decreases over time, pulse radiation with a radiation frequency that increases or decreases over time, pulsed radiation with an arbitrary pulse pattern, pulsed radiation with a predetermined pulse pattern, pulsed radia-tion with a probabilistic pulse pattern or sequence, or any other pulsed radiation pattern.

The colloidal nanoplate 400 may be a unipolar quantum fountain with three energy states: a valence state, a first conduction band state, and a second conduction band state. In embodiments described herein, the first conduction state is a lowest energy state in the conduction band with energy $E_1$, and the second conduction state is an excited energy state with energy $E_2$ that is greater than $E_1$, with $E_1$ and $E_2$ being subbands in the conduction band. In other embodiments, the nanoplate 400 may have three, four, five, or more quantum states including but not limited to orbital angular momentum states, spin states, fine structure states, Zeeman split states, Stark shifted states, Stark split states, degenerate states, or any other quantum state or energy state. In embodiments with only two excited energy states, it is to be understood that the term first excited state refers to the lower of the two excited energy states. In embodiments with more than two excited states it should be understood that the numerical labeling (i.e., first, second, third, etc.) denotes the relative energy levels of the excited states from the first excited state having a lowest excited energy level, to the second excited state having the next lowest excited energy level, to the third excited state having the third lowest excited energy level, and so on sequentially for each subsequent energy level. In any embodiment, the first conduction band state may be any state in the conduction band, and the second conduction state may be any other of the conduction band energy states.

Figure 5A:
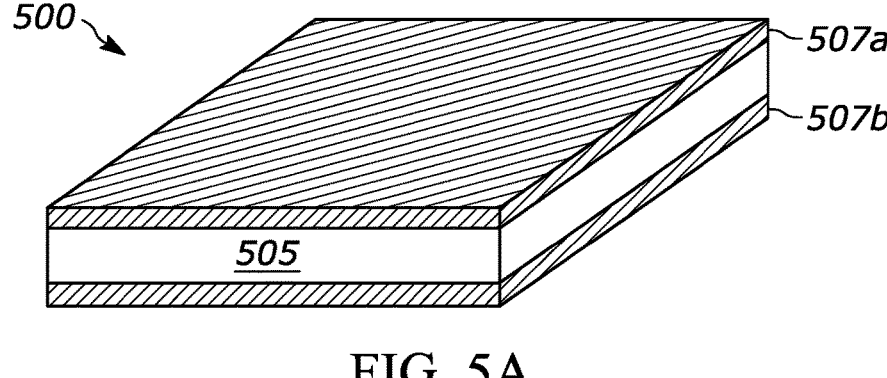
FIG. 5A illustrates a colloidal quantum fountain as a single monolayer nanoplate for performing optical gain.

FIG. 5A illustrates an embodiment of a colloidal quantum fountain for performing optical gain as a nanoplate 500 with a single monolayer as a quantum fountain layer 505 sand-wiched between first and second coating layers 507a and 507b. The nanoplate 500 may be synthesized in solutions by known colloid fabrication methods. The first and second coatings 507a and 507b may be ligand layers that assist with stabilizing the structure of the quantum fountain layer 505. In embodiments, the quantum fountain layer 505 may be a single monolayer of material, or multiple monolayers of materials depending on an optically active wavelength of interest. The thickness, or number of monolayers, of the colloidal quantum fountain 500 determines the electronic structure of the energy bands, including both the interband energy gaps (i.e., the bandgap energy between the valence and conduction bands) and the intersubband energy gaps (i.e., the energy differences between the conduction band energy states). Therefore, the absorption spectrum of the colloidal quantum fountain 500 may be engineered during fabrication by controlling the number of monolayers in the quantum fountain layer 505. The first and second coatings 507a and 507b may be a molecule or material for tuning of the gain band of the nanoplate 500. For example, the first and second coatings 507a and 207b may include one or more molecules including inorganic molecules, carboxylates, car-boxylic acids, thiolates, thiols, halide ions, pseudohalide ions, phsophonates, phosphonic acids, ammonium, amines, metal chalcogenides (e.g., $Sn_2S_4$ (2−)), thiocyanate, azide, and perovskite-type anions. Additionally, molecules of the first and second coatings 507a and 507 may be deposited on the nanoplate 500, or the first and second coatings 507a and 507b may form due to the nanoplate 500 being disposed in a suspension having the molecules and materials of the first and/or second coatings 507a and 507b.

Figure 5B:
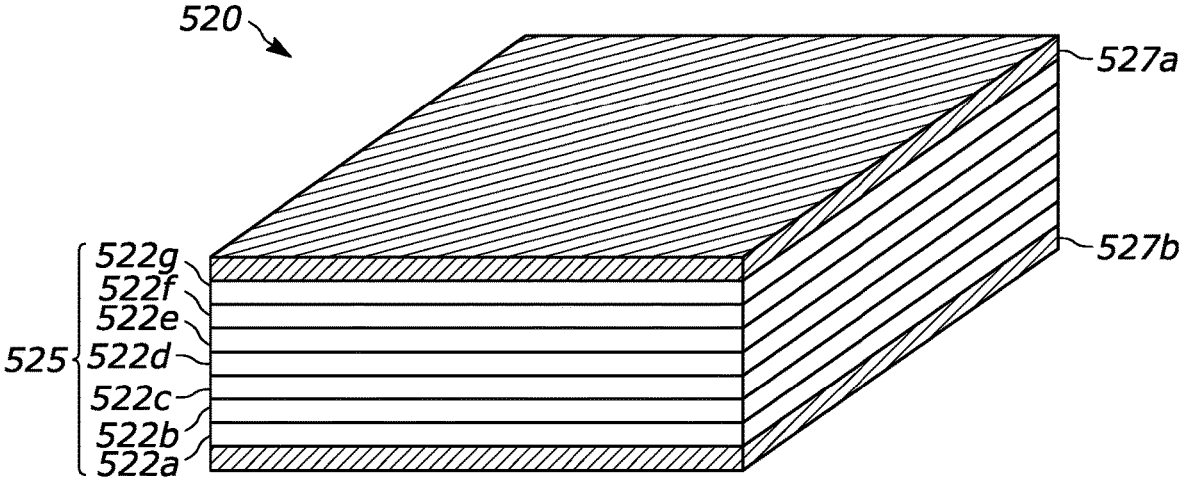
FIG. 5B illustrates an embodiment of a colloidal quantum fountain as a nanoplate having multiple monolayers.

FIG. 5B illustrates an embodiment of a colloidal quantum fountain 520 with a quantum fountain layer 525 with multiple monolayers 522a-522g of materials sandwiched between two coating layers 527a and 527b. In embodiments, the multiple monolayers 522a-522g may be the same material or different materials. In embodiments, the monolayers may be CdSe, zinc selenide, mercury selenide, lead sulfide, lead selenide, cadmium sulfide, cadmium telluride, indium arsenide, indium phosphide or any combination thereof. While illustrated as seven monolayers in FIG. 5B, the colloidal quantum fountain 520 may have any number of monolayers. The number of monolayers of a colloidal quantum fountain may depend on a desired optically active wavelength band. The number of layers may be used to tune the bandgap of the fountain 520, and/or the energy difference between energy states in the conduction band. While the embodiments disclosed herein focus on colloidal quantum fountain structures, similar quantum fountain materials may be fabricated by non-epitaxial and non-colloidal methods, such as by vapor-liquid-solid growth. As described herein, the nanoplates may also be referred to as a nanosheet.

Figure 6:
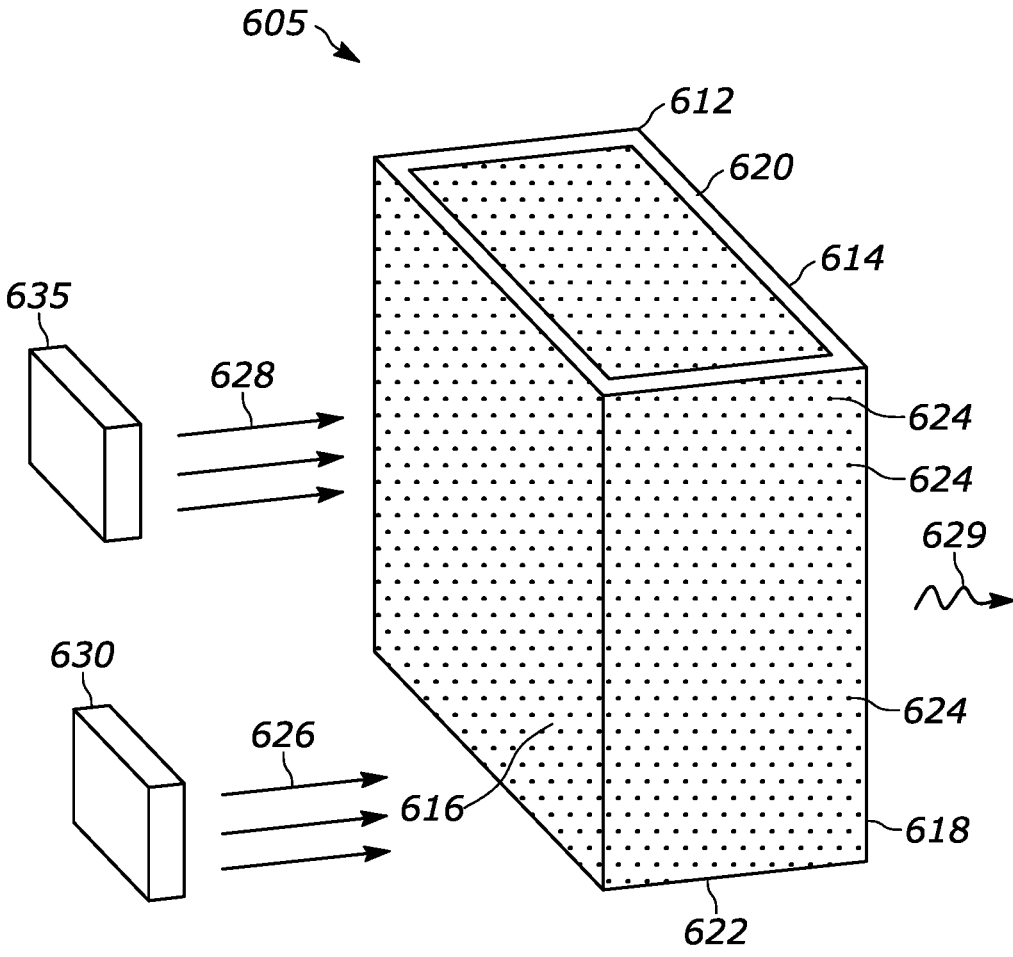
FIG. 6 illustrates an optical gain medium as a chamber having colloidal quantum fountains suspended therein.

Colloidal quantum fountains can be fabricated in solutions allowing for large volumes of colloidal quantum fountains to be fabricated simultaneously. Additionally, colloidal quantum fountains can be suspended in a solution, embedded or dispersed in a polymer, glass, organic material, organic solvent, or other material. Additionally, colloidal quantum fountains may be spin coated or sprayed onto arbitrarily shaped objects. Without the need for crystal matching, as is required for epitaxial quantum devices, colloidal quantum fountains can be used to fabricate gain materials with many different types of form factors. FIG. 6 illustrates an embodiment of a gain medium 605 which may be implemented as the gain medium for a lasing device, such as the lasing device 100 of FIG. 1. The gain medium 605 has a chamber 612 (e.g., a cuvette) that contains a solution 614. The chamber 612 has a front surface 616, a back surface 618, a top surface 620 and a bottom surface 622 which join together to create a cavity of the chamber 612 containing the solution 614. Colloidal quantum fountains 624 are dispersed throughout, and suspended in, the solution 614 contained in the chamber 612. A pump source 630 may provide pump radiation 626 and a seed source 635 may provide seed radiation 628 to the gain medium 600. Each of the pump radiation 626 and seed radiation 628 may be incident on the front surface 616, and transmitted to the solution 614 to excite the quantum fountains 624 for performing optical gain through inter-band pumping as described herein.

In embodiments, the top and bottom surfaces 620 and 622 of the gain medium 605 may be electrically conductive surfaces providing an electrical connection to the solution 614 and providing a means for electrical communication with the solution 614. In other embodiments, electrical leads or wires may be disposed in the solution 614 to provide electrical communication with the solution. A voltage may be applied to the conductive top and bottom surfaces 620 and 622 (or electrical leads) to provide a voltage across the solution 614 and to electrically excite the colloidal quantum fountains 624 across the bandgap of the quantum fountains 624 in the solution 614. In embodiments, the front and back surfaces 616 and 618 may be partially, or highly reflective surfaces to form an optical resonator for performing optical gain.

Figure 7:
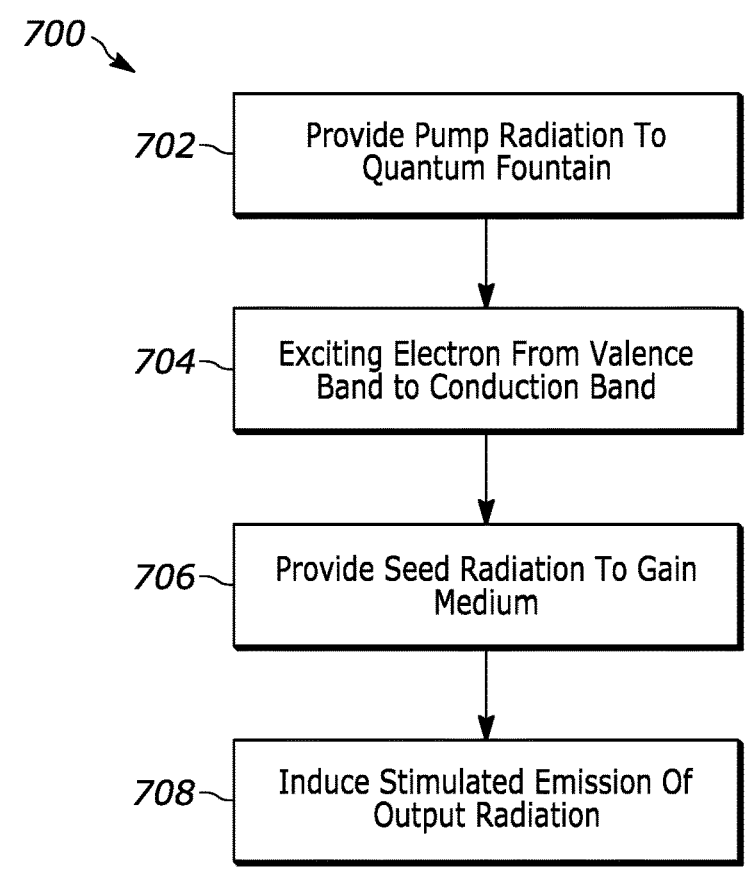
FIG. 7 is a flow diagram of a method for achieving interband optical band in a gain medium having colloidal quantum fountains.

FIG. 7 is a flow diagram of a method 700 for achieving optical gain in a gain medium, such as the gain medium 600 of FIG. 6. Referring simultaneously to FIGS. 6 and 7, the method 700 includes the pump source 630 providing the pump radiation 626 to quantum fountains 624 of the gain medium 605 (block 702). The pump source 630 may be a visible, or ultra-violet radiation source that provides visible or ultra-violet radiation to the gain medium. The visible and/or ultra-violet light has energies high enough to excite charge carriers from a valence band of the quantum fountains 624 to energy states in the conduction band of the quantum fountains 624.

Charge carriers are then excited across the bandgap of the quantum fountains 624 from the valence band to an excited energy state in the conduction band of the quantum fountains 624 (block 704). The charge carriers may be in the form of electrons, or of holes, but it should be understood that the quantum fountains 624 are unipolar devices. As described herein, unipolar devices only require a single charge carrier for performing optical gain. The disclosed interband pumped, intraband gain emission is achieved using a unipolar device, which is not achievable using bipolar devices that require the interaction of electrons and holes across a material bandgap.

The seed source 635 then provides the seed radiation 628 to the gain medium 605 (block 706). The seed source 635 may be an infrared radiation source that provides infrared radiation to the gain medium 605. The seed radiation 628 may have a wavelength of between 700 nm and 1.5 μm, between 500 nm and 1 μm, between 500 nm and 1.5 μm, between 1.3 and 1.5 μm, between 500 nm and 2 μm, or less than 2 μm.

Stimulated emission of radiation from the quantum fountains 624 is induced by the seed radiation 628 (block 708). The stimulated emission occurs when an excited charge carrier is de-excited from an excited conduction energy level, to a lower conduction band energy level resulting in the emission of electromagnetic radiation. The output radiation 629 has an energy that is dependent on the energy difference of the two conduction band energy states, and the corresponding energy of the seed radiation 628. The output radiation 629 may have a wavelength between 700 nm and 1.5 μm, between 500 nm and 1 μm, between 500 nm and 1.5 μm, between 1.3 and 1.5 μm, between 500 nm and 2 μm, less than 2 μm, or less than 3 μm. Further, the output radiation 629 has a frequency, phase, and propagation vector that depends on each corresponding frequency, phase, and propagation vector of the seed radiation 628. As such, the method 700 may be used for performing optical gain in a laser device.

Figure 8:
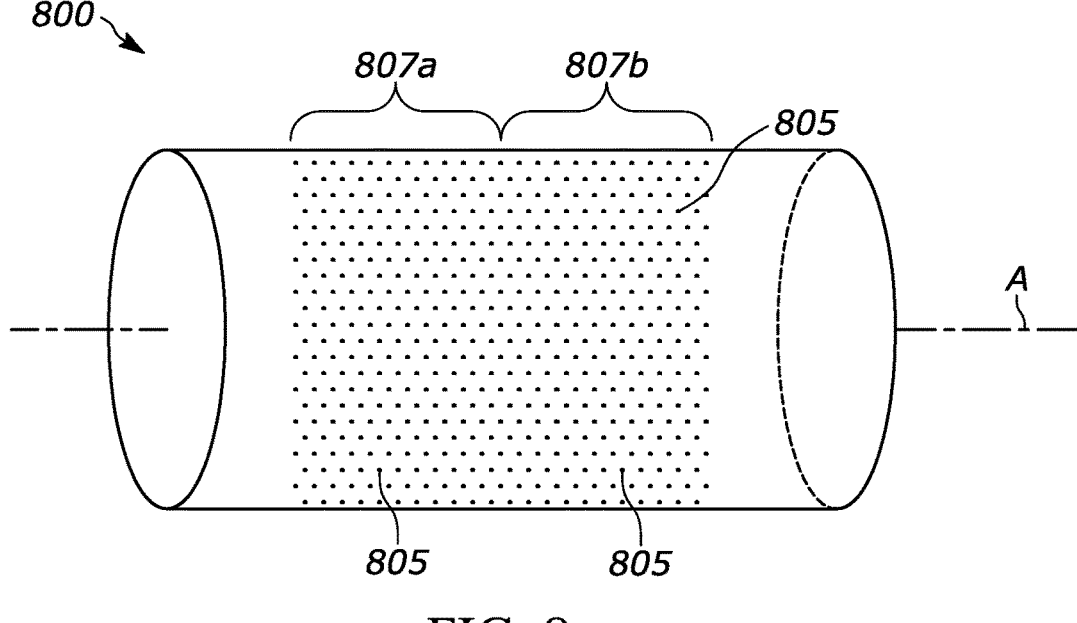
FIG. 8 illustrates an optical fiber segment having gain regions that contain colloidal quantum fountains.

The interband optical gain medium may include quantum fountains suspended in silica, or glass, in a waveguide, such as an optical fiber. FIG. 8 illustrates an optical fiber segment 800 with gain regions 807a and 807b along the length of the optical fiber segment 800. The fiber segment 800 has a length along optical axis A, along which light may propagate and be guided by the segment 800 for performing optical gain. Each of the gain regions 807a and 807b has suspended colloidal quantum fountains 805 therein. The quantum fountains 805 of the first gain region 807a may provide optical gain at a first set of wavelengths, while the quantum fountains 805 of the second gain region 807b may provide gain at a different set of wavelengths. For example, the quantum fountains 805 of the first gain region 807a may include different materials, or have different numbers of monolayers of material, than the quantum fountains 805 of the second gain region 807b. Further, the concentrations of quantum fountains 805 may be different in each of the first and second gain regions 807a and 807b to create a fiber amplification that includes multiple amplification stages. The optical fiber segment 800 is one embodiment of employing colloidal quantum wells 805 in a waveguide. Other embodiments may implement other waveguide materials such as plastics, liquids, nonlinear optical materials, and semiconductor materials among others. Additionally, waveguides allow for the possibility of multiple passes for radiation propagation providing higher multiple pass gain, which may be desirable for lasing devices. The fiber based optical device in the embodiment illustrated in FIG. 8 may be implemented in fiber communication systems and devices. Colloidal quantum fountains may be applied to any arbitrary surface or shape. For example, colloidal quantum wells may be suspended in an aerosol, paint, or lacquer and applied to any surface or volume.

Figure 9:
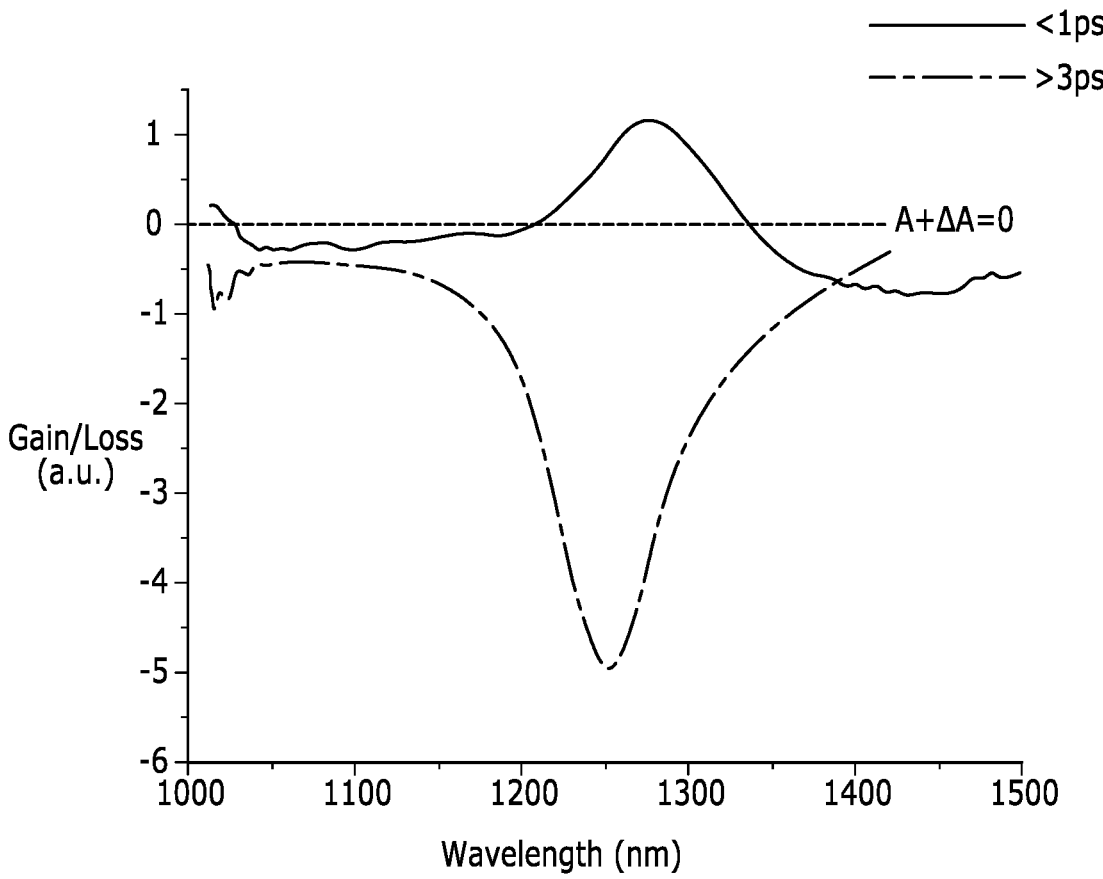
FIG. 9 is a plot of optical gain for a 5.5 monolayer CdSe colloidal quantum fountain with various time pump to seed pulse time delays.

Quantum fountains were fabricated having various numbers of monolayers. It was observed that photoexcitation wavelengths of between 266 nm and 400 nm were effective as pumps, depending on the thickness of the quantum fountain and corresponding energy distance between first and second conduction band states. FIG. 9 is a plot of gain and loss of a 5.5 monolayer colloidal quantum fountain with less than 1 ps delay between a pump and seed pulse, and greater than 3 ps delay between a pump and seed pulse. With greater than 3 ps delay, the quantum fountain is absorptive to infrared wavelengths around 1250 nm. This indicates that there is no population inversion of charge carriers in an excited state (i.e., second or higher excited state) of the conduction band. Therefore, the pump excites the charge carrier, and the charge carrier spontaneously decays to a first state of the conduction band before stimulated emission can be induced. The charge carriers in the first conduction state then absorb the infrared light and are promoted to excited states in the conduction band. The absorption curve with pump to seed pulse delay of less than 1 ps shows optical gain at the infrared wavelengths between 1250 and 1300 nm. Therefore, by providing a seed pulse within 1 ps of a pump pulse, stimulated emission is induced due to population inversion of charge carriers being at excited conduction band energy states.

Figure 10:
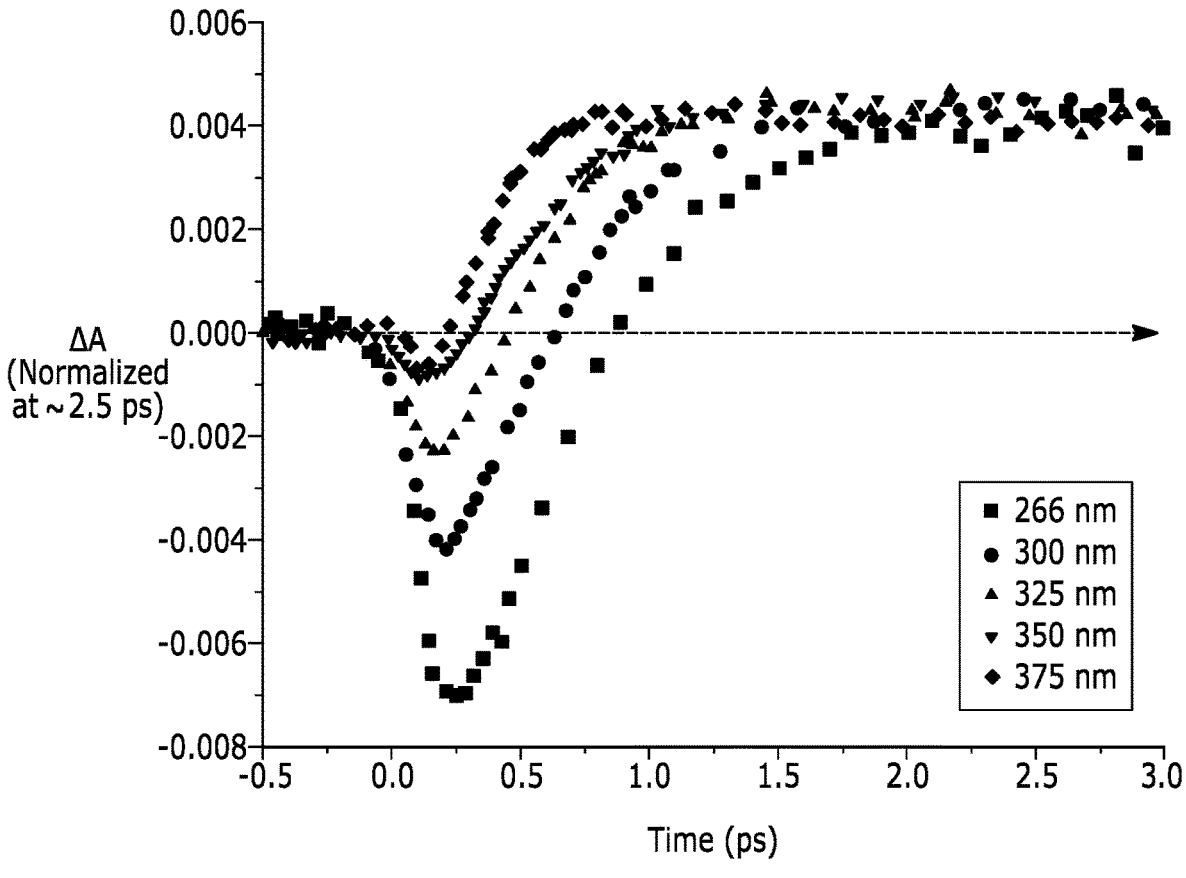
FIG. 10 is a plot of optical gain versus pump to seed pulse time delay for multiple pump wavelengths.

FIG. 10 is a plot of optical gain versus pump/seed delay time for multiple pump wavelengths for a 5.5 monolayer quantum fountain. Pumps having wavelengths of 266 nm, 300 nm, 325 nm, 350 nm, and 375 nm are reported. The gain is reported along the y-axis as change in absorption of the medium "ΔA." Absorption without the presence of pump radiation is approximately 0, and therefore gain is observed as the negative values with peaks between 0 and 0.5 ps in the plot showing more light being released than absorbed. As the pump wavelength is decreased, the gain increases. Shorter pump wavelengths means higher energies, therefore, the greater energy provided by the shorter wavelength pumps may excite electrons into higher excited conduction band states allowing for increased intraband stimulated emission when applying a seed pulse.

Figure 11:
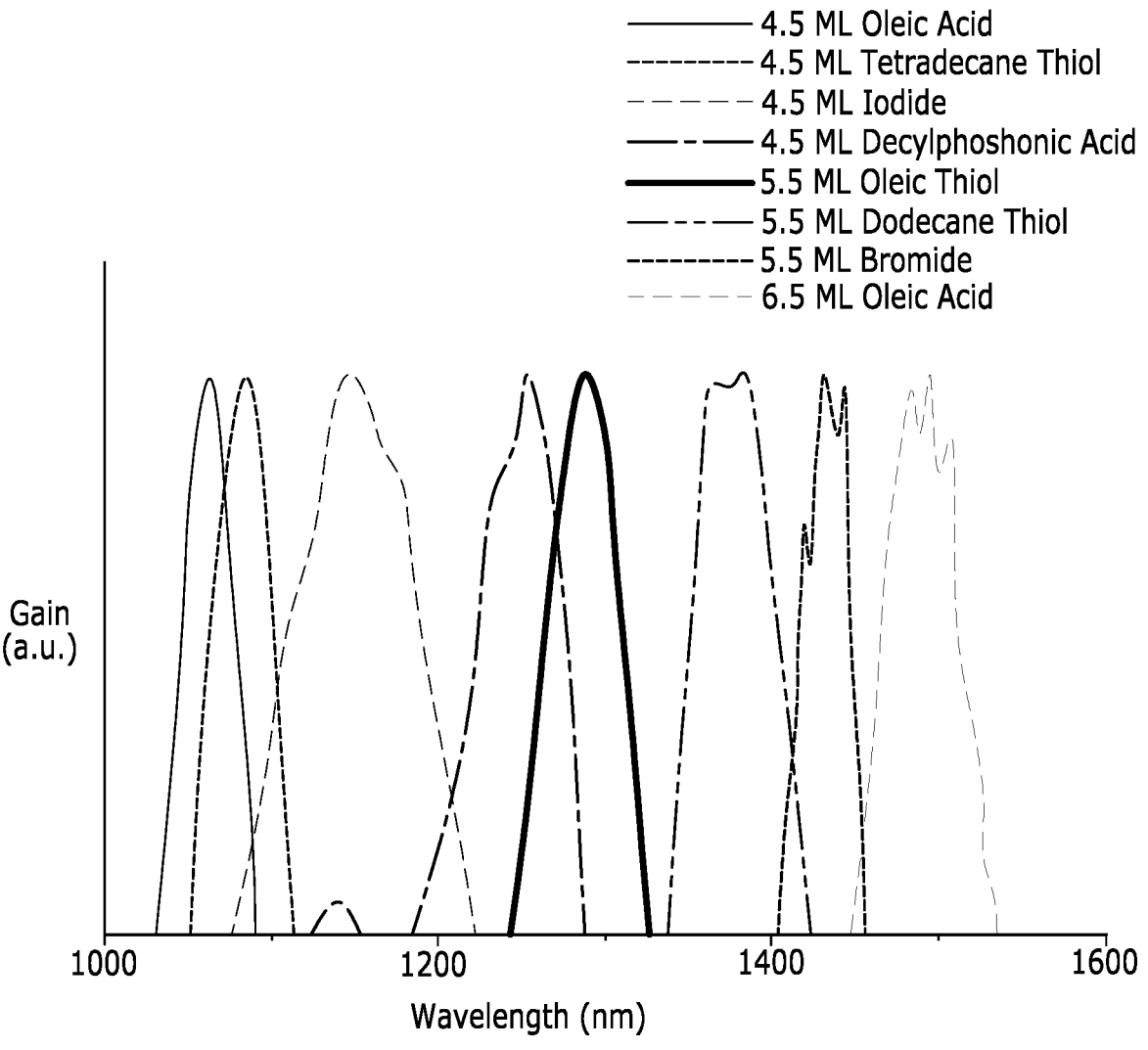
FIG. 11 is a plot of intraband gain spectra for 4.5, 5.5, and 6.5 monolayer nanoplates as quantum fountains.

FIG. 11 is a plot of gain spectra for 4.5, 5.5, and 6.5 monolayer CdSe nanoplates as a quantum fountain. The plot of FIG. 11 reports spectra for colloidal nanoplates suspended in various media, as indicated by the legend of FIG. 11. The different types of suspension media further effect the surface tension, and therefore energy bandgaps, of the colloidal quantum fountains in each respective media. For example, molecules of the suspension media may bind to surfaces of the colloidal nanoplates changing the energy bands of the nanoplate, resulting in shifted energies of the gain band. The molecules of the media that bind to the nanoplates may be considered as the first and second coatings 507a and 507b as illustrated in FIG. 5A, or first and second coatings 527a and 527b as illustrated in FIG. 5B. The molecules that bind to the nanoplate may include carboxylates (e.g., oleic acid), thiols (e.g., dodecane thiol), halide ions, and/or phosphonic acids (e.g., decylphosphonic acid) among other chemicals and molecules. Both the number of monolayers, and the outer coatings of the nanoplates may be used to tune the gain band of the nanoplates. The 4.5 monolayer quantum fountains exhibited gain peaks between 1000 nm and 1300 nm, while the 5.5 and 6.5 monolayer quantum fountains exhibited gain peaks at longer wavelengths of around 1280 and longer. The data of FIG. 11 shows the wavelength tuneability of optical gain mediums with the quantum fountains and interband pumped optical gain methods described herein. Typical optical gain mediums are limited in gain bandwidths, or are not tunable, whereas the disclosed methods and materials provide a robust wavelength tunable optical gain medium.

Figure 12:
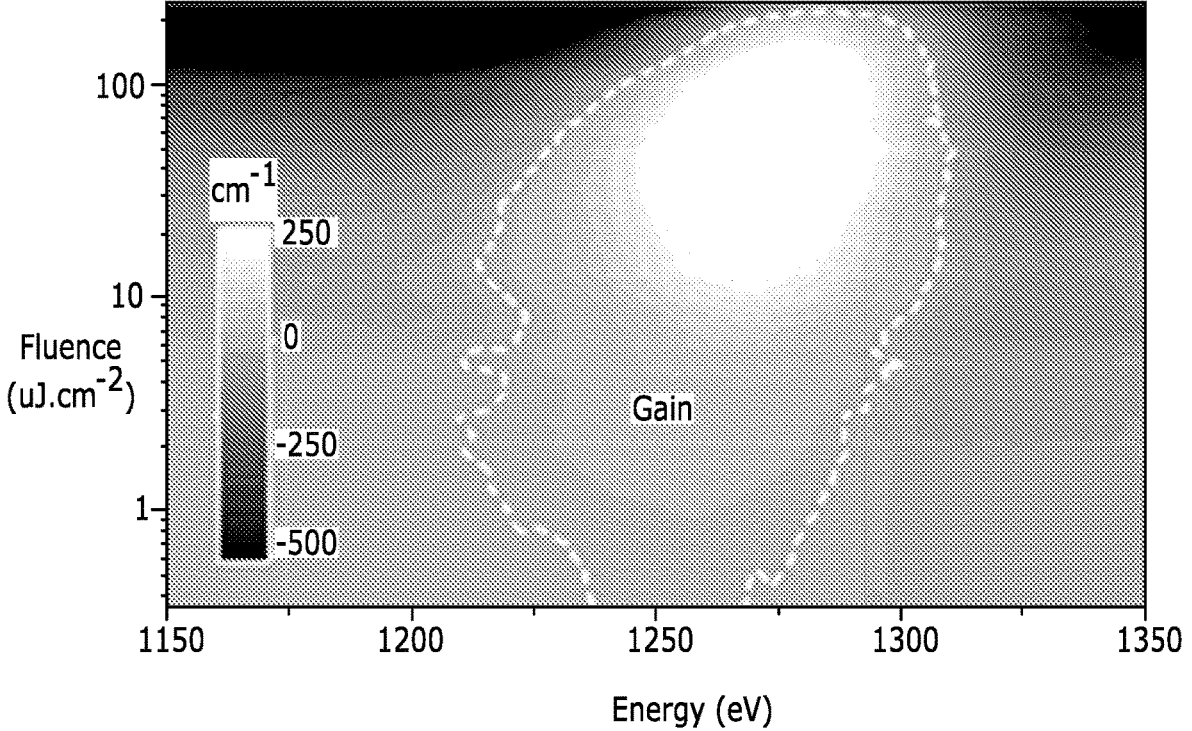
FIG. 12 is a map of fluence versus wavelength for colloidal quantum fountains with 5.5 monolayers of CdSe.

FIG. 12 is a map of fluence versus wavelength. The data of FIG. 12 shows thresholdless operation of the optical gain medium. A 350 nm pump was used to excite 5.5 monolayer CdSe nanoplate colloidal quantum fountains. The optical gain, or loss, of the 5.5 monolayer CdSe nanoplates was measured at a fixed time interval between the pump and seed pulses. The magnitude of the gain or loss is reported in inverse centimeters, and is estimated based upon reported linear absorption coefficients of the CdSe colloidal quantum fountains and surrounding suspension materials. The data presented in FIG. 12 indicates that the colloidal quantum fountains can provide gain with very low power pump pulses because, in principle, and as demonstrated, there is no threshold power necessary. The lack of a gain power threshold is another advantage over epitaxial gain mediums, and other types of pumped optical gain mediums that may require high threshold powers to achieve any gain.

The following list of aspects reflects a variety of the embodiments explicitly contemplated by the present disclosure. Those of ordinary skill in the art will readily appreciate that the aspects below are neither limiting of the embodiments disclosed herein, nor exhaustive of all of the embodiments conceivable from the disclosure above, but are instead meant to be exemplary in nature.

1. A method of achieving optical gain, the method comprising: providing pump radiation to a gain medium, the gain medium having (i) a valence energy band, (ii) a first excited conduction energy band, (iii) a second excited conduction energy band, and (iv) a charge carrier in the valence energy band; exciting, by the pump radiation, the charge carrier from the valence band to the second excited conduction energy; providing seed radiation to the gain medium and de-exciting the charge carrier from the second excited conduction energy band to the first excited conduction energy band; and inducing, by the seed radiation, stimulated emission of output radiation, with the output radiation having an energy dependent on the energy difference of the second excited conduction energy band and first excited conduction energy band.

2. A method according to aspect 1, wherein the gain medium comprises a plurality of colloidal nanoplates.

3. A method according to either of aspect 1 or 2, wherein the gain medium comprises a cadmium selenide nanoplate.

4. A method according to any of aspects 1 to 3, wherein the gain medium comprises a semiconductor nanoplate.

5. A method according to aspect 4, wherein the semiconductor nanoplate has an outer coating disposed thereon.

6. A method according to aspect 5, wherein the outer coating comprises one or more of a surfactant of inorganic molecules, carboxylates, carboxylic acids, thiolates, thiols, halide ions, pseudohalide ions, phosphonates, phosphonic acids, ammonium, and amines.

7. A method according to aspect 5, wherein the outer coating comprises a material and a thickness that together cause the stimulated emission to have a wavelength shorter than 2 microns.

8. A method according to any of aspects 1 to 7, wherein the pump radiation has a wavelength in the ultraviolet range.

9. A method according to any of aspects 1 to 7, wherein the pump radiation has a wavelength shorter than 500 nanometers.

10. A method according to any of aspects 1 to 9, wherein the seed radiation has a wavelength in the infrared region and the stimulated emission has a wavelength in the infrared region.

11. A method according to any of aspects 1 to 9, wherein the seed radiation has a wavelength between 1.3 microns and 1.5 microns, and the stimulated emission has a wavelength between 1.3 microns and 1.5 microns.

12. A method according to any of aspects 1 to 7, wherein the seed radiation has a wavelength shorter than 2 microns, and the stimulated emission has a wavelength shorter than 3 microns.

13. A method according to any of aspects 1 to 12, wherein the gain medium comprises a unipolar gain material.

14. A lasing device comprising: a gain medium disposed in an optical cavity, the gain medium having a plurality of colloidal nanoplates, with the colloidal nanoplates having a (i) valence energy band, (ii) first excited conduction energy band, (iii) second excited conduction energy band, and (iv) a charge carrier in the valence energy band; a pump radiation source disposed to provide pump radiation to the gain medium, the pump radiation having an energy capable of exciting the charge carrier from the valence energy band to the second conduction energy band; and a seed radiation source disposed to provide seed radiation to the gain medium, the seed radiation having an energy capable of causing de-excitation of the charge carrier from the second excited conduction energy band, to the first excited conduction energy band and inducing stimulated emission of output radiation.

15. A lasing device according to aspect 14, wherein the plurality of colloidal nanoplates comprises cadmium selenide nanoplates.

16. A lasing device according to either of aspects 14 or 15, wherein at least a portion of the plurality of colloidal nanoplates have an outer coating disposed thereon.

17. A lasing device according to aspect 16, wherein the outer coating comprises a surfactant coating of inorganic molecules.

18. A lasing device according to aspect 16, wherein the outer coating comprises a material and a thickness that together cause the stimulated emission to have a wavelength shorter than 2 microns.

19. A lasing device according to any of aspects 14 to 18, wherein the pump radiation has a wavelength shorter than 500 nanometers.

20. A lasing device according to any of aspects 14 to 19, wherein the seed radiation has a wavelength of less than 2 microns.

What is claimed is:

1. A lasing device comprising:
a gain medium disposed in a resonant optical cavity, the gain medium having a plurality of colloidal nanoplates, with the colloidal nanoplates having a (i) valence energy band, (ii) first excited conduction energy band, (iii) second excited conduction energy band, and (iv) a charge carrier in the valence energy band;
a pump radiation source disposed to provide pump radiation to the gain medium, the pump radiation having an energy configured to excite the charge carrier from the valence energy band to the second excited conduction energy band; and
a seed radiation source disposed to provide seed radiation to the gain medium, the seed radiation source configured to cause de-excitation of the charge carrier from the second excited conduction energy band, to the first excited conduction energy band and inducing stimulated emission of output radiation.

2. The lasing device of claim 1, wherein the plurality of colloidal nanoplates comprises cadmium selenide nanoplates.

3. The lasing device of claim 1, wherein at least a portion of the plurality of colloidal nanoplates have an outer coating disposed thereon.

4. The lasing device of claim 3, wherein the outer coating comprises one of a surfactant coating of inorganic molecules, carboxylates, thiols, halide ions, phosphonic acids, or amines.

5. The lasing device of claim 3, wherein the outer coating comprises a material and a thickness that together cause the stimulated emission to have a wavelength shorter than 2 microns.

6. The lasing device of claim 1, wherein the pump radiation has a wavelength shorter than 500 nanometers.

7. The lasing device of claim 1, wherein the seed radiation has a wavelength of less than 2 microns.

* * * * *